(12) United States Patent
Ishii

(10) Patent No.: US 10,950,600 B2
(45) Date of Patent: Mar. 16, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventor: Yuji Ishii, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/248,251

(22) Filed: Jan. 15, 2019

(65) Prior Publication Data

US 2019/0259749 A1 Aug. 22, 2019

(30) Foreign Application Priority Data

Feb. 20, 2018 (JP) .............................. JP2018-028057

(51) Int. Cl.
| | |
|---|---|
| *H01L 29/78* | (2006.01) |
| *H01L 27/07* | (2006.01) |
| *H01L 29/423* | (2006.01) |
| *H01L 29/08* | (2006.01) |
| *H01L 29/40* | (2006.01) |
| *H01L 29/36* | (2006.01) |
| *H01L 21/8238* | (2006.01) |
| *H01L 29/66* | (2006.01) |
| *H01L 29/10* | (2006.01) |

(Continued)

(52) U.S. Cl.
CPC .. *H01L 27/0727* (2013.01); *H01L 21/823828* (2013.01); *H01L 21/823871* (2013.01); *H01L 21/823878* (2013.01); *H01L 27/0922* (2013.01); *H01L 29/0865* (2013.01); *H01L 29/0882* (2013.01); *H01L 29/1095* (2013.01);
*H01L 29/36* (2013.01); *H01L 29/402* (2013.01); *H01L 29/42356* (2013.01); *H01L 29/66681* (2013.01); *H01L 29/7818* (2013.01); *H01L 21/823814* (2013.01); *H01L 27/0629* (2013.01)

(58) Field of Classification Search
None
See application file for complete search history.

(56) References Cited

U.S. PATENT DOCUMENTS

2015/0035056 A1* 2/2015 Kuwazawa ......... H01L 29/1095
257/343
2015/0380546 A1* 12/2015 Komatsu ............... H01L 27/088
257/337

(Continued)

FOREIGN PATENT DOCUMENTS

JP 2014-229819 A 12/2014

OTHER PUBLICATIONS

Mun Nam Chil et al., "Advanced 300mm 130nm BCD technology from 5V to 85V with Deep-Trench Isolation", ISPSD2016, pp. 403-406, 2016.

*Primary Examiner* — Benjamin P Sandvik
(74) *Attorney, Agent, or Firm* — McDermott Will & Emery LLP

(57) ABSTRACT

Provided are a semiconductor device capable of preventing erroneous operation and providing a field plate effect, and a method of manufacturing the semiconductor device. In a diode, a gate electrode, a p+ source region, and an n-type body region are electrically coupled to one another. A contact region is disposed between the n-type body region and the p+ source region in a first surface of a semiconductor substrate.

15 Claims, 11 Drawing Sheets

(51) Int. Cl.
*H01L 27/092* (2006.01)
*H01L 27/06* (2006.01)

(56) References Cited

U.S. PATENT DOCUMENTS

2016/0181421 A1* 6/2016 Yang .................. H01L 29/7823
                                                    438/151
2017/0291415 A1* 10/2017 Matsumoto ......... H01L 27/0285
2018/0122794 A1* 5/2018 Sun ...................... H01L 29/402

* cited by examiner

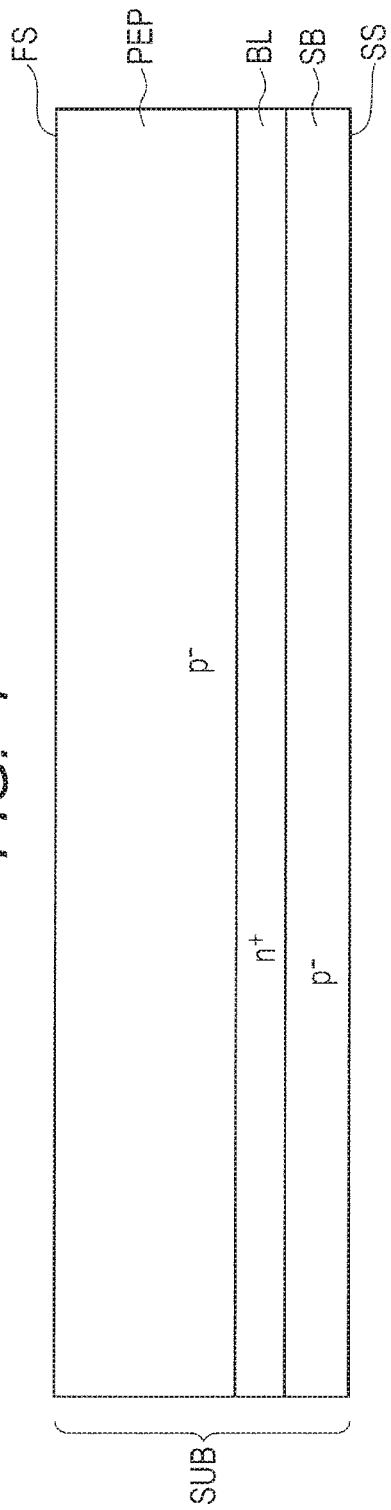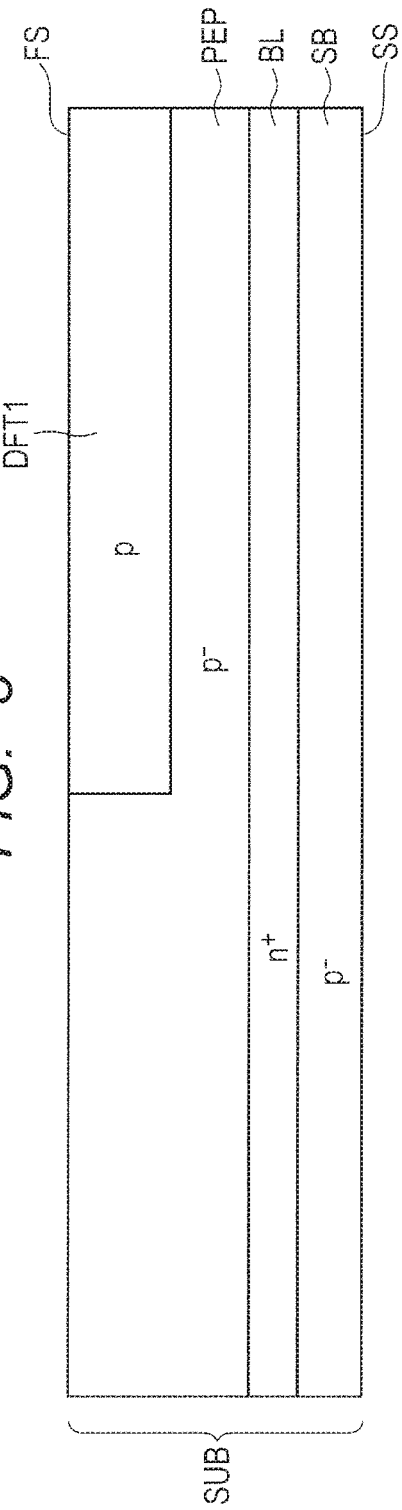

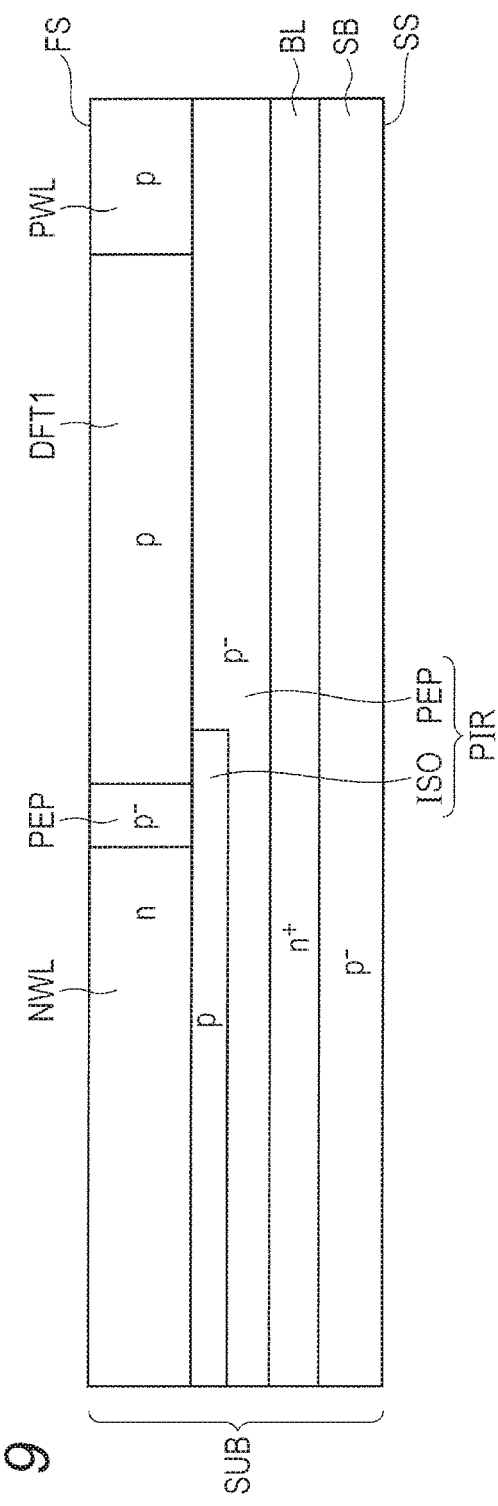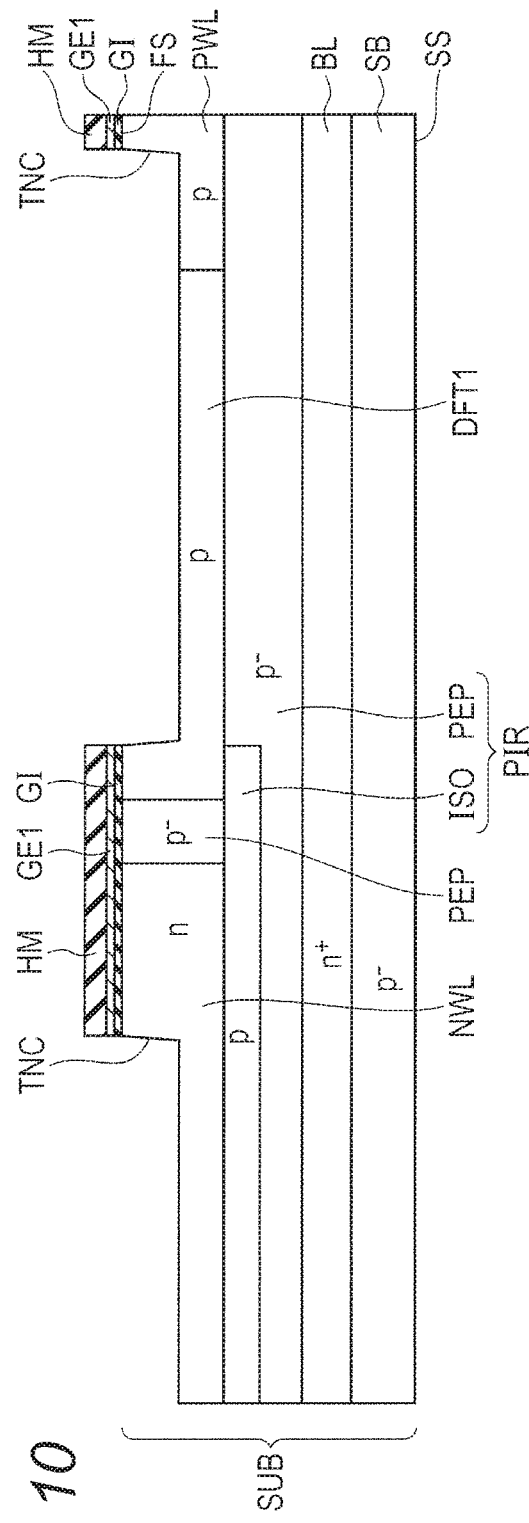

SEMICONDUCTOR DEVICE AND METHOD OF MANUFACTURING THE SAME

CROSS-REFERENCE TO RELATED APPLICATIONS

The disclosure of Japanese Patent Application No. 2018-028057 filed on Feb. 20, 2018 including the specification, drawings and abstract is incorporated herein by reference in its entirety.

BACKGROUND

The present invention relates to a semiconductor device and a method of manufacturing the semiconductor device.

A bipolar complementary metal oxide semiconductor (BiC-DMOS) including a laterally diffused metal oxide semiconductor (LDMOS) transistor and a complementary metal oxide semiconductor (CMOS) transistor is used in cars, motor drives, audio amplifiers, and the like. For example, the LDMOS transistor of the BiC-DMOS used for monitoring a vehicle-mounted battery requires a high withstand voltage.

Such an LDMOS transistor is described in Mun Nam Chil et al., "Advanced 300 mm 130 nm BCD technology from 5V to 85V with Deep-Trench Isolation", ISPSD2016, pp. 403-406, 2016, for example. A back-gate structure of the LDMOS transistor has an n-type buried region (NBL), an n-type epitaxial layer (N-EPI) coupled to the n-type buried region (NBL), and an n-type body region (N-Body) coupled to the n-type epitaxial layer (N-EPI).

Japanese Unexamined Patent Application Publication No. 2014-229819 discloses that a range of operation voltage, in which on current increases, is widened in a diode configured by short-circuiting between an emitter and a base of a bipolar transistor.

SUMMARY

The gate, the source, and the body of the LDMOS transistor described in Mun Nam Chil et al., "Advanced 300 mm 130 nm BCD technology from 5V to 85V with Deep-Trench Isolation", ISPSD2016, pp. 403-406, 2016 are provably short-circuited to one another to configure an anode isolated diode (AID). In such a case, when a negative voltage is applied to the gate, a forward bias voltage is applied to a diode including an n-type body and a p-type drain, leading to current flow.

In the AID, when a negative voltage is applied to the gate, a channel is formed and thus a negative potential is applied to the source. This leads to hole flow from the drain to the source, and thus the MOS transistor is turned on in a reverse direction. This results in current flow through the MOS transistor in a low voltage region of the gate, causing erroneous operation.

The bipolar transistor described in Japanese Unexamined Patent Application Publication No. 2014-229819 has no gate. The bipolar transistor therefore does not provide a field plate effect by a gate. This prevents electric field concentration at a substrate surface from being relived, and thus allows an electric field to be easily concentrated, leading to low withstand voltage.

Other objects and novel features will be clarified from the description of this specification and the accompanying drawings.

A semiconductor device of one embodiment includes a semiconductor substrate, a first-conductivity-type body region, a second-conductivity-type drain region, a second-conductivity-type source region, a gate electrode, and a first-conductivity-type first impurity region. The semiconductor substrate has a main surface. The body region is disposed in the main surface of the semiconductor substrate. The drain region is also disposed in the main surface of the semiconductor substrate. The source region is disposed in the main surface of the semiconductor substrate so as to lie across the body region from the drain region. The gate electrode is disposed over the main surface of the semiconductor substrate and isolatedly opposed to the body region. The first impurity region has a higher concentration of a first-conductivity-type impurity than the body region. The gate electrode, the source region, and the body region are electrically coupled to one another. The first impurity region is disposed between the body region and the source region in the main surface of the semiconductor substrate.

A method of manufacturing a semiconductor device of one embodiment has the following steps.

A first-conductivity-type body region is formed in a main surface of a semi substrate. Agate electrode is formed in the main surface of the semiconductor substrate so as to be isolatedly opposed to the body region. A second-conductivity-type drain region and a second-conductivity-type source region are formed in the main surface of the semiconductor substrate so as to lie across the gate electrode from each other. A first-conductivity-type first impurity region is formed while having a higher concentration of a first-conductivity-type impurity than the body region. The gate electrode, the source region, and the body region are formed so as to be electrically coupled to one another. The first impurity region is formed so as to be disposed between the body region and the source region in the main surface of the semiconductor substrate.

According to the above-described embodiment, it is possible to achieve a semiconductor device capable of preventing erroneous operation and providing a field plate effect by a gate, and achieve a method of manufacturing the semiconductor device.

BRIEF DESCRIPTION OF THE DRAWINGS

FIG. 7 is a schematic sectional view showing a first step of a method of manufacturing the semiconductor device of the embodiment.

FIG. 8 is a schematic sectional view showing a second step of the method.

FIG. 9 is a schematic sectional view showing a third step of the method.

FIG. 10 is a schematic sectional view showing a fourth step of the method.

DETAILED DESCRIPTION

Hereinafter, one embodiment will be described with reference to the accompanying drawings.

Figure 1:
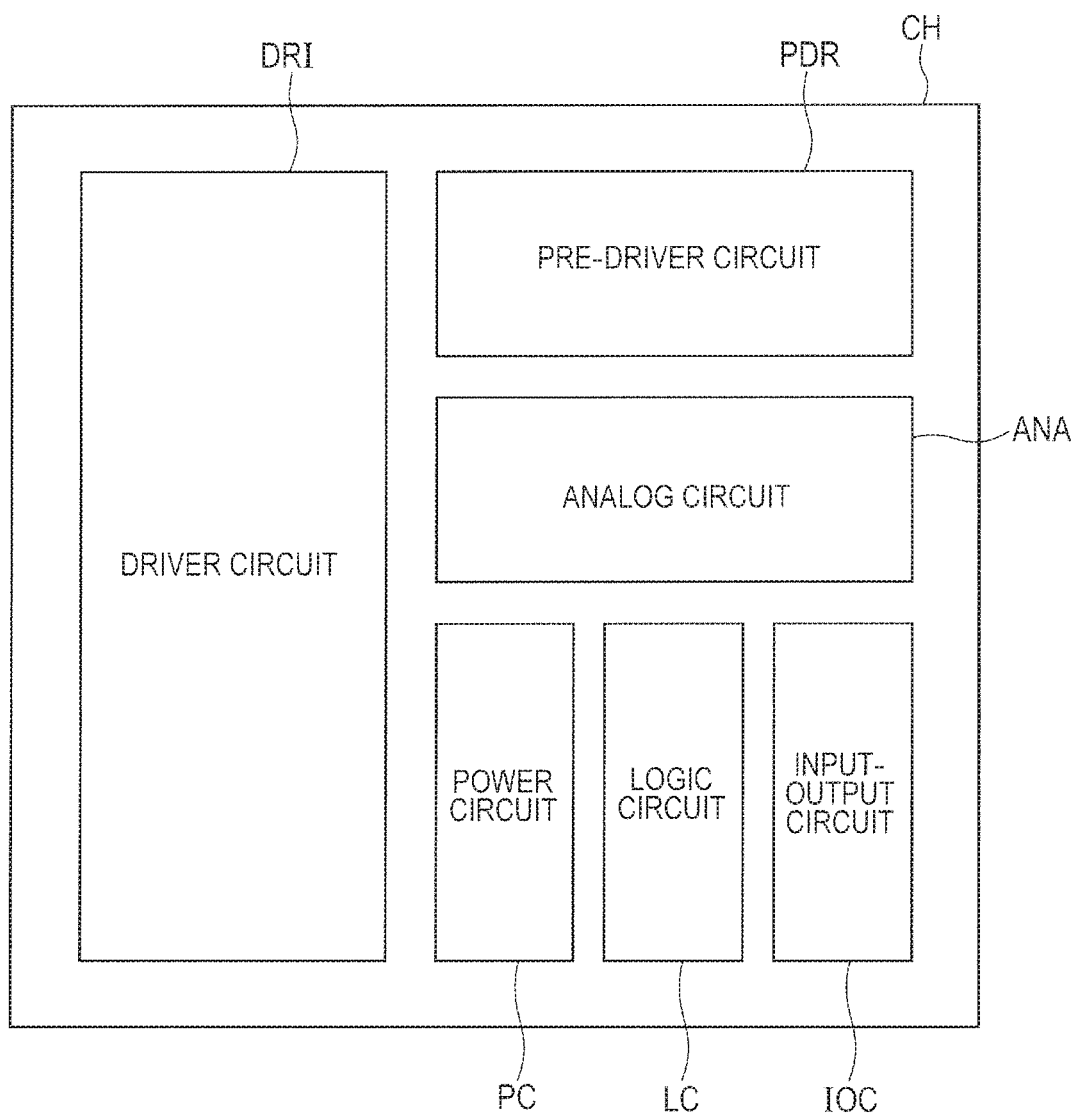
FIG. 1 is a plan view schematically illustrating a configuration of a semiconductor device as a chip of one embodiment.

As shown in FIG. 1, a semiconductor device CH of this embodiment is a semiconductor chip having a semiconductor substrate, for example. Formation regions of a driver circuit DRI, a pre-driver circuit PDR, an analog circuit ANA, a power circuit PC, a logic circuit LC, and an input/output circuit IOC are disposed in a surface of the semiconductor substrate.

The semiconductor device of this embodiment is not limited to the semiconductor chip, but may be a device on a wafer or packaged with a sealing resin.

Figure 2:
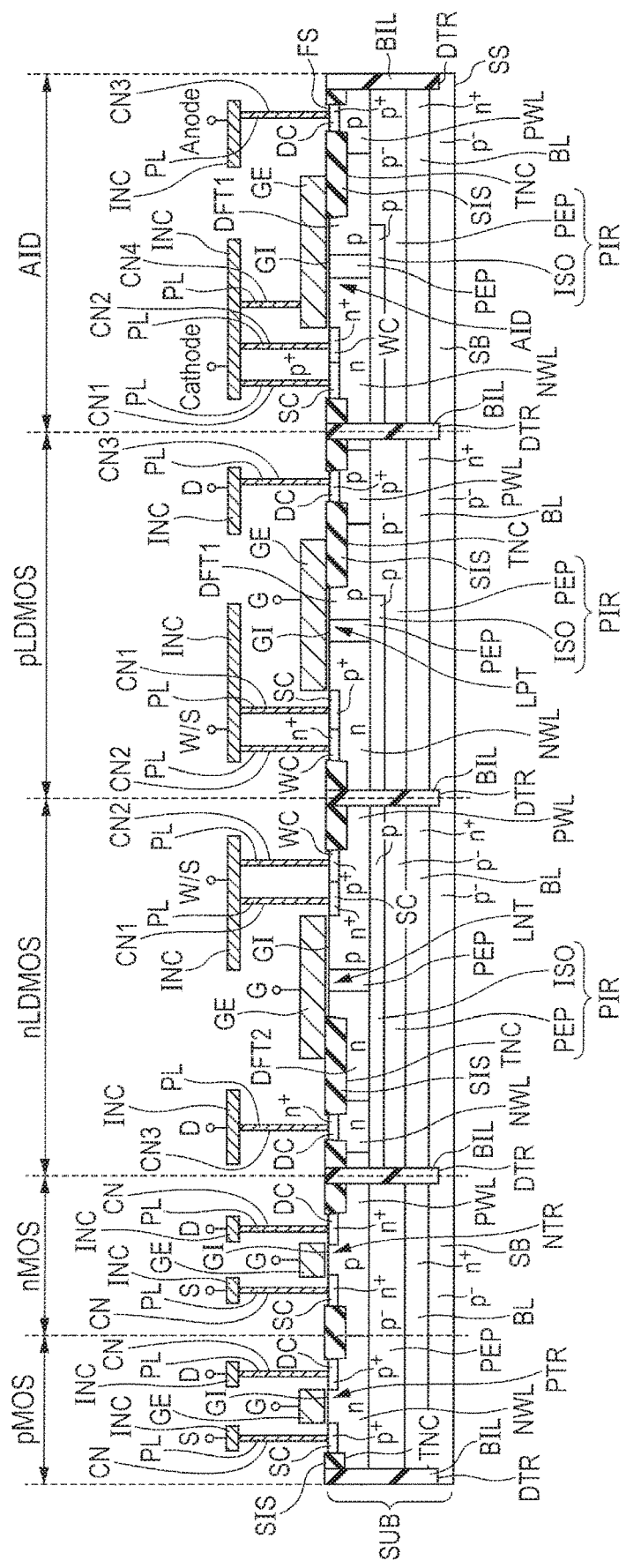
FIG. 2 is a sectional view illustrating the configuration of the semiconductor device of FIG. 1.

As shown in FIG. 2, the semiconductor device of this embodiment includes high-withstand-voltage (HV) CMOS transistors LNT and LPT, logic CMOS transistors NTR and PTR, and a diode AID.

The high-withstand-voltage CMOS transistors include a p-channel LDMOS transistor LPT and an n-channel LDMOS transistor LNT. The logic CMOS transistors include an n-channel MOS transistor NTR and a p-channel MOS transistor PTR.

Hereinafter, the n-channel LDMOS transistor is mentioned as nLDMOS transistor, and the p-channel LDMOS transistor is mentioned as pLDMOS transistor. The n-channel MOS transistor is mentioned as nMOS transistor, and the p-channel MOS transistor is mentioned as pMOS transistor.

A semiconductor substrate SUB has a first surface FS (main surface) and a second surface SS opposed to each other. The transistors and the diode AID are formed in the first surface FS of a semiconductor substrate SUB. The formation regions of the respective transistors are electrically isolated from one another by deep trench isolation (DTI). The DTI includes a trench DTR formed in the first surface FS of the semiconductor substrate SUB and an insulating layer BIL filling the trench DTR.

A $p^-$ substrate region SB is disposed in the second surface SS of the semiconductor substrate SUB in each of the formation regions of the logic CMOS transistors NTR and PTR. An n-type buried region BL and a $p^-$ epitaxial region PEP are disposed in order on the first surface FS side of the $p^-$ substrate region SB. A p-type well region PWL and an n-type well region NWL are disposed side by side on the first surface FS side of the $p^-$ epitaxial region PEP. The nMOS transistor NTR is disposed in the p-type well region PWL. The pMOS transistor PTR is disposed in the n-type well region NWL.

The formation region of the nMOS transistor NTR is electrically isolated from the formation region of the pMOS transistor PTR by shallow trench isolation (STI). The STI includes an isolation trench TNC formed in the first surface FS of the semiconductor substrate SUB and an isolation insulating layer SIS filling the isolation trench TNC.

The isolation trench TNC of the STI is disposed shallower from the first surface FS than the isolation trench DTR of the DTI. The isolation trench TNC of the STI is disposed shallower than the p-type well region PWL and the n-type well region NWL.

The nMOS transistor NTR has an $n^+$ source region SC, an $n^+$ drain region DC, a gate insulating layer GI, and a gate electrode GE. The $n^+$ source region SC and the $n^+$ drain region DC are disposed at an interval from each other in the first surface FS in the p-type well region PWL. The gate electrode GE is disposed over the first surface FS, which is located between the $n^+$ source region SC and the $n^+$ drain region DC, with the gate insulating layer GI in between.

The pMOS transistor PTR has a $p^+$ source region SC, a $p^+$ drain region DC, the gate insulating layer GI, and the gate electrode GE. The $p^+$ source region SC and the $p^+$ drain region DC are disposed at an interval from each other in the first surface FS in the n-type well region NWL. The gate electrode GE is disposed over the first surface FS, which is located between the $p^+$ source region SC and the $p^+$ drain region DC, with the gate insulating layer GI in between.

The $p^-$ substrate region SB is disposed in the second surface SS of the semiconductor substrate SUB in a formation region of the pLDMOS transistor LPT. The n-type buried region BL and a p-type impurity region PIR are disposed in order on the first surface FS side of the $p^-$ substrate region SB.

The p-type impurity region PIR includes the $p^-$ epitaxial region PEP and a p-type anti-punch-through layer ISO. The $p^-$ epitaxial region PEP configures a pn junction in conjunction with the $n^+$ buried region BL. The p-type anti-punch-through layer ISO has a higher p-type impurity concentration than the $p^-$ epitaxial region PEP. The p-type anti-punch-through layer ISO is disposed on the first surface FS side of the $p^-$ epitaxial region PEP.

An n-type body region NWL, the $p^-$ epitaxial region PEP, a p-type drift region DFT1, and the p-type well region PWL are mainly disposed on the first surface FS side of the p-type impurity region PIR. The n-type body region NWL lies across the $p^-$ epitaxial region PEP from the p-type drift region DFT1. The p-type drift region DFT1 lies between the $p^-$ epitaxial region PEP and the p-type well region PWL.

The pLDMOS transistor LPT has the $p^+$ source region SC, the $p^+$ drain region DC, the gate insulating layer GI, and the gate electrode GE. The $p^+$ source region SC is disposed in the first surface FS so as to configure a pn junction in conjunction with the n-type body region NWL. An $n^+$ contact region WC having a higher impurity concentration than the n-type body region NWL is disposed in the first surface FS so as to be adjacent to the $p^+$ source region SC. The $p^+$ drain region DC is disposed in the first surface FS so as to be in contact with the p-type well region PWL.

The STI is disposed in the first surface FS between the $p^+$ source region SC and the $p^+$ drain region DC. The STI includes the isolation trench TNC and the isolation insulating layer SIS filling the isolation trench TNC.

The gate electrode GE is disposed over the first surface FS, which is located between the $p^+$ source region SC and the STI, with the gate insulating layer GI in between. The gate electrode GE is isolatedly opposed to the first surface FS located between the $p^+$ source region SC and the STI. The gate electrode GE overrides the isolation insulating layer SIS of the STI. The gate electrode GE is opposed to the p-type drift region DFT1 with the isolation insulating layer SIS of the STI in between.

The p⁻ substrate region SB is disposed in the second surface SS of the semiconductor substrate SUB in the formation region of the nLDMOS transistor LNT.

The n-type buried region BL and the p-type impurity region PIR are disposed in order on the first surface FS side of the p⁻ substrate region SB.

The p-type impurity region PIR includes the p⁻ epitaxial region PEP and the p-type anti-punch-through layer ISO. The p⁻ epitaxial region PEP configures a pn junction in conjunction with the n⁺ buried region BL. The p-type anti-punch-through layer ISO has a higher p-type impurity concentration than the p⁻ epitaxial region PEP. The p-type anti-punch-through layer ISO is disposed on the first surface FS side of the p⁻ epitaxial region PEP.

The p-type body region PWL, the p⁻ epitaxial region PEP, an n-type drift region DFT2, and the n-type well region NWL are mainly disposed on the first surface FS side of the p-type impurity region PIR. The p-type body region PWL lies across the p⁻ epitaxial region PEP from the n-type drift region DFT2. The n-type drift region DFT2 configures a pn junction in conjunction with the p⁻ epitaxial region PEP, and lies between the p⁻ epitaxial region PEP and the n-type well region NWL.

The nLDMOS transistor LNT has an n⁺ source region SC, the n⁺ drain region DC, the gate insulating layer GI, and the gate electrode GE. The n⁺ source region SC is disposed in the first surface FS so as to configure a pn junction in conjunction with the p-type body region PWL. A p⁺ contact region WC having a higher p-type impurity concentration than the p-type body region PWL is disposed in the first surface FS so as to be adjacent to the n⁺ source region SC. The n⁺ drain region DC is disposed in the first surface FS so as to be in contact with the n-type well region NWL.

The STI is disposed in the first surface FS between the n⁺ source region SC and the n⁺ drain region DC. The STI includes the isolation trench TNC and the isolation insulating layer SIS filling the isolation trench TNC.

The gate electrode GE is disposed over the first surface FS, which is located between the n⁺ source region SC and the STI, with the gate insulating layer GI in between. The gate electrode GE is isolatedly opposed to the first surface FS located between the n⁺ source region SC and the STI. The gate electrode GE overrides the isolation insulating layer SIS of the STI. The gate electrode GE is opposed to the n-type drift region DFT1 with the isolation insulating layer SIS of the STI in between.

An interconnection layer INC is electrically coupled to the respective impurity regions (n⁺ source region SC, n⁺ drain region DC, n⁺ contact region WC, p⁺ source region SC, p⁺ drain region DC, p⁺ contact region WC).

Specifically, an undepicted interlayer insulating layer is disposed so as to cover the first surface FS of the semiconductor substrate SUB. Contact holes CN are disposed in the interlayer insulating layer so as to extend up to the respective impurity regions. A plug conductive layer PL is buried in each contact hole CN. The interconnection layer INC is disposed on the interlayer insulating layer so as to be in contact with the plug conductive layers PL. As a result, the interconnection layer INC is electrically coupled to the respective impurity regions via the plug conductive layers PL.

The diode AID shown in FIG. 2 is now described with reference to FIGS. 3 to 6. The diode AID is basically different from the pLDMOS transistor LPT shown in FIG. 2 in that the gate electrode GE is electrically coupled to the p⁺ source region SC and the n-type body region NWL, and that arrangement of the p⁺ source region SC and the n⁺ contact region WC (first impurity region) is modified.

Figure 3:
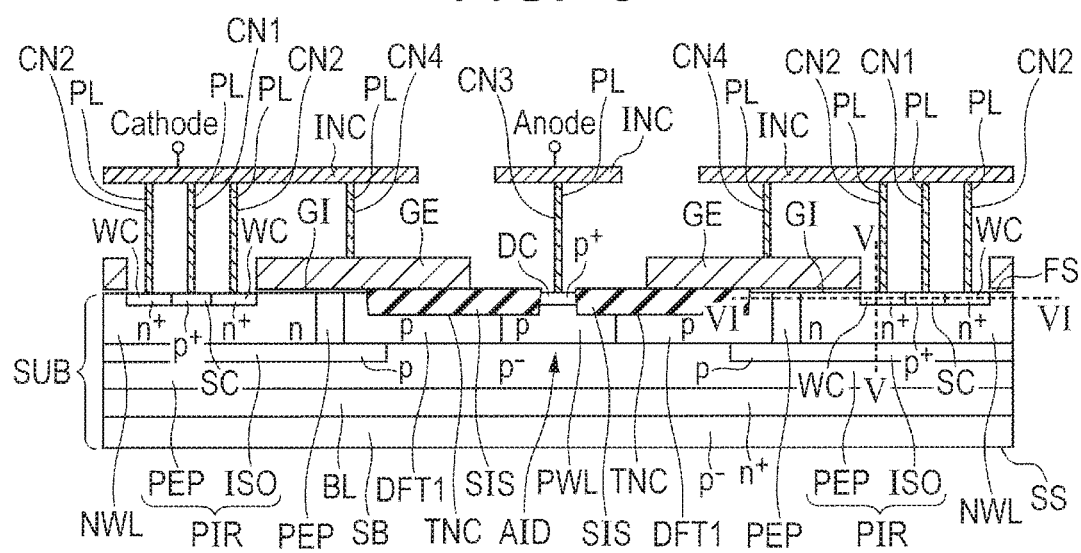
FIG. 3 is a schematic sectional view along a line III-III in FIG. 4, illustrating a configuration of an AID shown in FIG. 2.

Hereinafter, plan view means a viewpoint from a direction orthogonal to the first surface FS of the semiconductor substrate SUB. The sectional structure of the diode AID in FIG. 2 is shown in a simplified manner and thus shown differently from the sectional structure of FIG. 3. The diode AID of this embodiment may be configured as shown in FIG. 3 or may be configured in a simplified manner as shown in FIG. 2. Hereinafter, the configuration shown in FIG. 3 is described as an example of the diode AID.

As shown in FIG. 3, the p⁻ substrate region SB is disposed in the second surface SS of the semiconductor substrate SUB in the formation region of the diode AID. The n⁺ buried region BL (buried region) is disposed on the first surface FS side of the p⁻ substrate SB. The n⁺ buried region BL is disposed separately from the second surface SS. The n⁺ buried region BL has a floating potential.

The n⁺ buried region BL configures a pn junction in conjunction with the p⁻ substrate region SB. The p-type impurity region PIR (impurity region) is disposed on the first surface FS side of the n⁺ buried region BL. The p-type impurity region PIR configures a pn junction in conjunction with the n⁺ buried region BL.

The p-type impurity region PIR includes the p⁻ epitaxial region PEP and the p-type anti-punch-through layer ISO. The p⁻ epitaxial region PEP configures a pn junction in conjunction with the n⁺ buried region BL. The p-type anti-punch-through layer ISO has a higher p-type impurity concentration than the p⁻ epitaxial region PEP. The p-type anti-punch-through layer ISO is disposed on the first surface FS side of the p⁻ epitaxial region PEP.

The n-type body region NWL (body region), the p⁻ epitaxial region PEP, the p-type drift region DFT1, and the p-type well region PWL are mainly disposed on the first surface FS side of the p-type impurity region PIR.

The n-type body region NWL lies across the p⁻ epitaxial region PEP from the p-type drift region DFT1. The n-type body region NWL configures a pn junction in conjunction with the p⁻ epitaxial region PEP. The p-type drift region DFT1 lies between the p⁻ epitaxial region PEP and the p-type well region PWL.

The second surface SS side of the p-type well region PWL is entirely in contact with the p⁻ epitaxial region PEP. The p-type well region PWL has a higher p-type impurity concentration than the p⁻ epitaxial region PEP. The p⁺ drain region DC is disposed in the first surface FS in the p-type well region PWL. The p⁺ drain region DC has a higher p-type impurity concentration than the p-type well region PWL. The p-type drift region DFT1 is disposed so as to be adjacent to the p-type well region PWL.

A part of the second surface SS side of the p-type drift region DFT1 is in contact with the p⁻ epitaxial region PEP of the p-type impurity region PIR. The rest of the second surface SS side of the p-type drift region DFT1 is in contact with the p-type anti-punch-through layer ISO of the p-type impurity region PIR. The p-type drift region DFT1 has a higher p-type impurity concentration than the p⁻ epitaxial region PEP.

The n-type body region NWL is formed on the first surface FS side of the n⁺ buried region BL, and configures a pn junction in conjunction with the p-type impurity region PIR. Specifically, the entire second surface SS side of the n-type body region NWL configures a pn junction in conjunction with the p-type anti-punch-through layer ISO of the p-type impurity region PIR.

The p⁻ epitaxial region PEP may not be disposed between the n-type body region NWL and the p-type drift region DFT1 so that the n-type body region NWL and p-type drift region DFT1 configure the pn junction.

The p⁺ source region SC and the n⁺ contact regions WC are disposed in the first surface FS in the n-type body region NWL. The p⁺ source region SC is adjacent to each n⁺ contact region WC in the first surface FS. The p⁺ source region SC configures a pn junction in conjunction with each of the n-type well region NWL and the n⁺ contact region WC. The p⁺ source region SC is formed in the first surface FS so as to lie across the n-type body region NWL and the p-type drift region DFT1 from the p⁺ drain region DC. The n⁺ contact region WC has a higher n-type impurity concentration than the n-type body region NWL. The n⁺ contact regions WC are disposed in the first surface FS so as to lie across the p⁺ source region SC from each other.

The STI is disposed between the p⁺ source region SC and the p⁺ drain region DC. The STI includes the isolation trench TNC and the isolation insulating layer SIS filling the isolation trench TNC. The isolation insulating layer SIS is disposed in the first surface FS between the p⁺ drain region DC and the n-type body region NWL.

The gate electrode GE is disposed over the first surface FS, which is located between the p⁺ source region SC and the STI, with the gate insulating layer GI in between. The gate electrode GE is isolatedly opposed to the first surface FS located between the p⁺ source region SC and the STI. Specifically, the gate electrode GE is isolatedly opposed to the n-type body region NWL and the p-type drift region DFT1, which are located between the p⁺ source region SC and the STI. The gate electrode GE overrides the isolation insulating layer SIS of the STI. The gate electrode GE is opposed to the p-type drift region DFT1 with the isolation insulating layer SIS of the STI in between.

In the diode AID of this embodiment, each n⁺ contact region WC is disposed between the n-type body region NWL and the p⁺ source region SC in the first surface FS. The n⁺ contact region WC is disposed between a region directly below the gate electrode GE and the p⁺ source region SC.

An undepicted interlayer insulating layer is disposed over the first surface FS of the semiconductor substrate SUB so as to cover the diode AID. The interlayer insulating layer has contact holes CN1, CN2, CN3, and CN4 that extend up to the p⁺ source region SC, the n⁺ contact regions WC, the p⁺ drain region DC, and the gate electrode GE, respectively. The plug conductive layer PL is buried in each of the contact holes CN1, CN2, CN3, and CN4. The interconnection layer INC is disposed on the interlayer insulating layer IS so as to be in contact with the plug conductive layers PL. As a result, the interconnection layer INC is electrically coupled to the respective impurity regions via the plug conductive layers PL.

In the diode AID of this embodiment, the gate electrode GE, the p⁺ source region SC, and the n-type body region NWL are electrically coupled to one another through the interconnection layer INC and the plug conductive layers PL.

Figure 4:
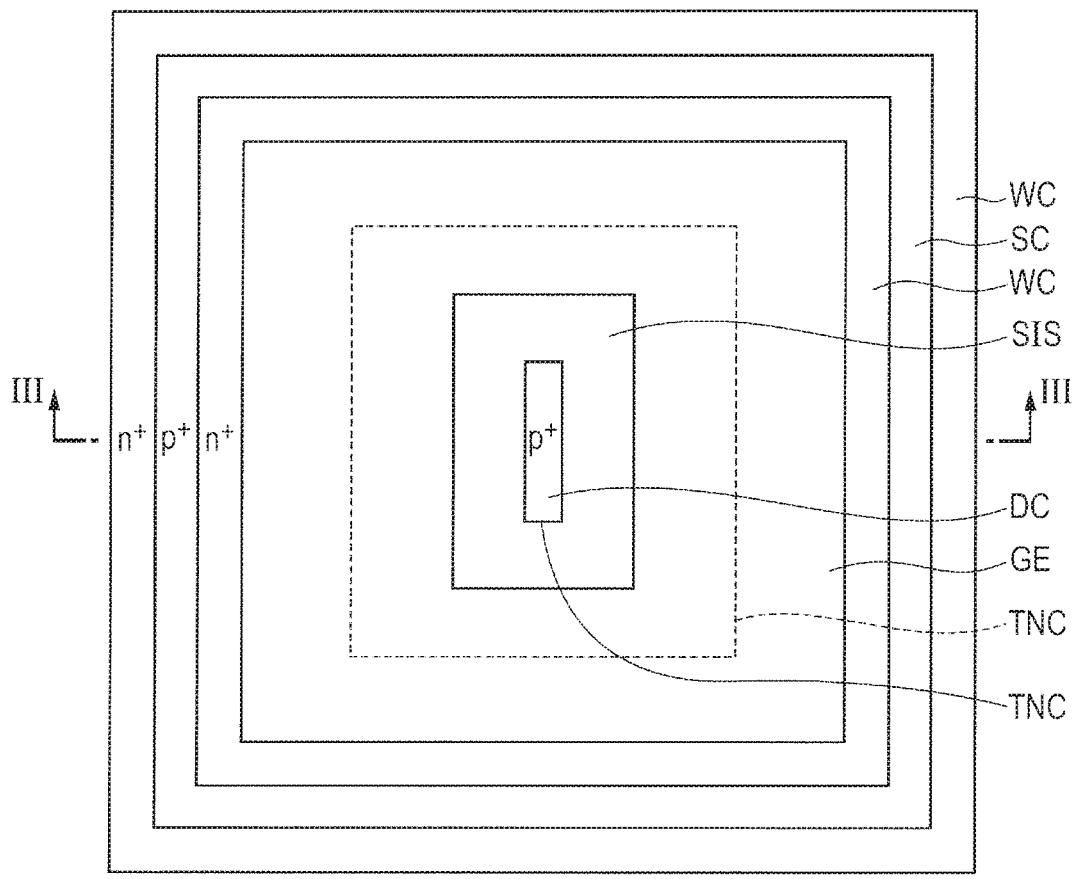
FIG. 4 is a plan view showing a formation region of the AID shown in FIG. 2.

FIG. 4 is a plan view showing the formation region of the diode AID shown in FIG. 3. As shown in FIG. 4, the p⁺ drain region DC is disposed in the first surface FS of the semiconductor substrate SUB in plan view. The STI (the isolation trench TNC and the isolation insulating layer SIS) is disposed so as to surround the entire periphery of the p⁺ drain region DC in plan view.

The gate electrode GE is also disposed so as to surround the entire periphery of the p⁺ drain region DC in plan view.

One n⁺ contact region WC is disposed so as to surround the entire peripheral region of the gate electrode GE in plan view. The p⁺ source region SC is disposed so as to surround the entire periphery of the one n⁺ contact region WC while configuring a pn junction in conjunction with the n⁺ contact region WC in plan view. The other n⁺ contact region WC (second impurity region) is disposed so as to surround the entire periphery of the p⁺ source region SC while configuring a pn junction in conjunction with the p⁺ source region SC.

An impurity concentration distribution in a depth direction (direction from the first surface FS to the second surface SS) and an impurity concentration distribution in a lateral direction (direction along the first surface FS) of a portion near the n⁺ contact regions WC are now described with reference to FIGS. 5 and 6.

Figure 5:
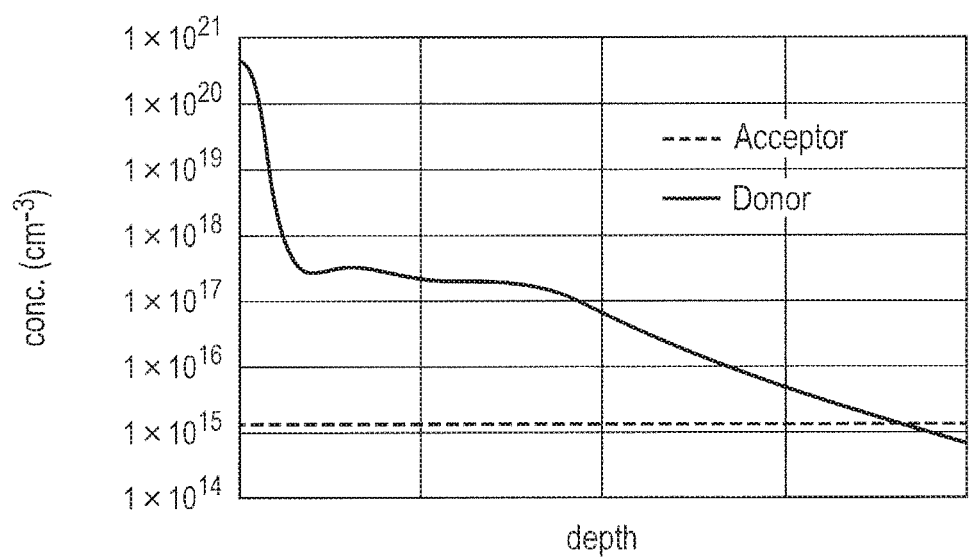
FIG. 5 shows impurity concentration distribution of a portion along a line V-V in FIG. 3.
Figure 6:
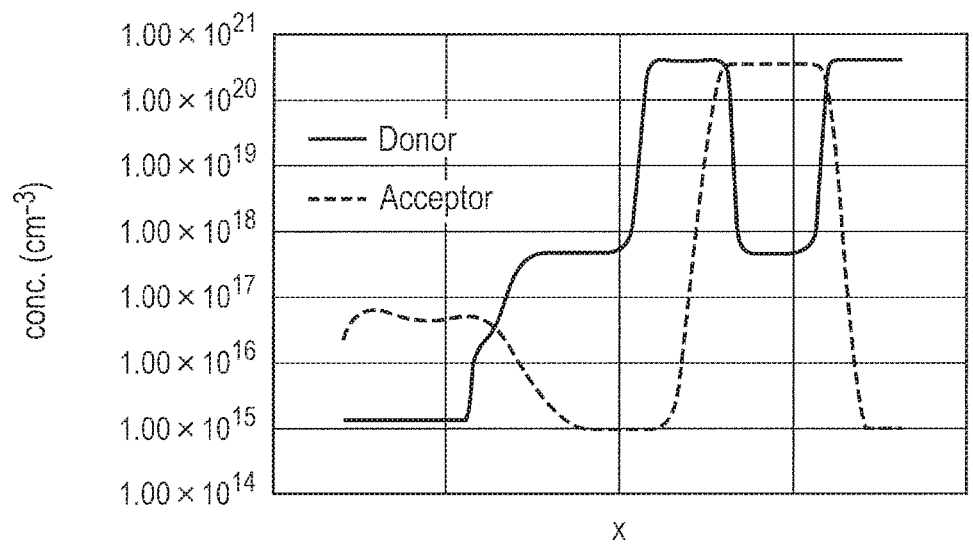
FIG. 6 shows impurity concentration distribution of a portion along a line VI-VI in FIG. 3.

FIGS. 5 and 6 show an impurity concentration distribution of a portion along a line V-V in FIG. 3 and an impurity concentration distribution of a portion along a line VI-VI in FIG. 3, respectively. In FIGS. 5 and 6, a broken line indicates a concentration distribution of acceptors, and a solid line indicates a concentration distribution of donors.

As shown in FIGS. 5 and 6, an n-type impurity concentration (donor concentration) of the n⁺ contact region WC has a peak value of about $1 \times 10^{20}$ to $1 \times 10^{21}$ cm⁻³. The n-type body region NWL has an n-type impurity concentration (donor concentration) of about $1 \times 10^{17}$ to $1 \times 10^{18}$ cm⁻³. The n-type impurity concentration of the n⁺ contact region WC is at least 100 times higher than the n-type impurity concentration of the n-type body region NWL. The p-type anti-punch-through layer ISO has a p-type impurity concentration (acceptor concentration) of about $1 \times 10^{15}$ cm⁻³, for example.

A method of manufacturing the diode AID of this embodiment is now described with reference to FIGS. 7 to 13. FIGS. 7 to 13 each show a section corresponding to the section of FIG. 2.

As shown in FIG. 7, the n⁺ buried region BL is formed on the first surface FS side of the p⁻ substrate region SB in the formation region of the diode AID. The n⁺ buried region BL is formed so as to have a floating potential. The p⁻ epitaxial region PEP is formed on the first surface FS side of the n⁺ buried region BL. The p⁻ epitaxial region PEP is formed so as to configure a pn junction in conjunction with the n⁺ buried region BL.

As shown in FIG. 8, an undepicted first photoresist pattern is formed by a typical photoengraving technique on the first surface FS of the semiconductor substrate SUB. The first photoresist pattern is used as a mask to perform ion implantation of a p-type impurity onto the first surface FS of the semiconductor substrate SUB. As a result, the p-type drift region DFT1 is formed in the first surface FS of the p⁻ epitaxial region PEP. The p-type drift region DFT1 is formed so as to have a higher p-type impurity concentration than the p⁻ epitaxial region PEP. Subsequently, the first photoresist pattern is removed by asking, for example.

As shown in FIG. 9, an undepicted second photoresist pattern is formed by a typical photoengraving technique on the first surface FS of the semiconductor substrate SUB. The second photoresist pattern is used as a mask to perform ion implantation of an n-type impurity onto the first surface FS of the semiconductor substrate SUB. As a result, the n-type body region NWL is formed on the first surface FS side of the n⁺ buried region BL. The n-type body region NWL is formed in the first surface FS so as to lie across the p⁻ epitaxial region PEP from the p-type drift region DFT1.

The n-type body region NWL and the p-type drift region DFT1 may be formed so as to directly configure a pn junction. Subsequently, the second photoresist pattern is removed by asking, for example.

Subsequently, an undepicted third photoresist pattern is formed by a typical photoengraving technique on the first surface FS of the semiconductor substrate SUB. The third photoresist pattern is used as a mask to perform ion implantation of a p-type impurity into the semiconductor substrate SUB. As a result, the p-type anti-punch-through layer ISO is formed in the p$^-$ epitaxial region PEP. The p-type anti-punch-through layer ISO is formed so as to have a higher p-type impurity concentration than the p$^-$ epitaxial region PEP, and to be located on the first surface FS side of the p$^-$ epitaxial region PEP.

The p-type anti-punch-through layer ISO and the p$^-$ epitaxial region PEP collectively form the p-type impurity region PIR. The p-type impurity region PIR is formed so as to be disposed between the n$^+$ buried region BL and the n-type body region NWL, and to isolate the n$^+$ buried region BL from the n-type body region NWL. The p-type drift region DFT1 is located on the first surface side of the p-type impurity region PIR.

The p-type anti-punch-through layer ISO is formed so as to be located on the second surface SS side of each of some p-type drift region DFT1, the p$^-$ epitaxial region PEP, and the n-type body region NWL. The p-type anti-punch-through layer ISO is formed so as to be in contact with the entire second surface SS side of the n-type body region NWL and with part of the second surface SS side of the p-type drift region DFT1. Subsequently, the third photoresist pattern is removed by asking, for example.

As shown in FIG. 10, the gate insulating layer GI including, for example, a silicon oxide film is formed on the first surface FS of the semiconductor substrate SUB. The gate insulating layer GI is formed with a thickness of several micrometers to several tens of micrometers, for example. A conductive film GE1 made of, for example, polycrystalline silicon (doped polysilicon) containing an impurity introduced therein is formed on the gate insulating layer GI. A hard mask layer HM including, for example, a silicon nitride film is formed on the conductive film GE1. The conductive film GE1 and the hard mask layer HM are each formed with a thickness of several tens of nanometers, for example.

Subsequently, the hard mask layer HM is patterned by a typical photoengraving technique and an etching technique. The patterned hard mask layer HM is used as a mask to etch the conductive film GE1, the gate insulating layer GI, and the semiconductor substrate SUB. Through this etching, the isolation trench TNC of the STI is formed in the first surface FS of the semiconductor substrate SUB. The isolation trench TNC is formed shallower than each of the n-type body region NWL, the p-type drift region DFT1, and the p-type well region PWL.

Figure 11:
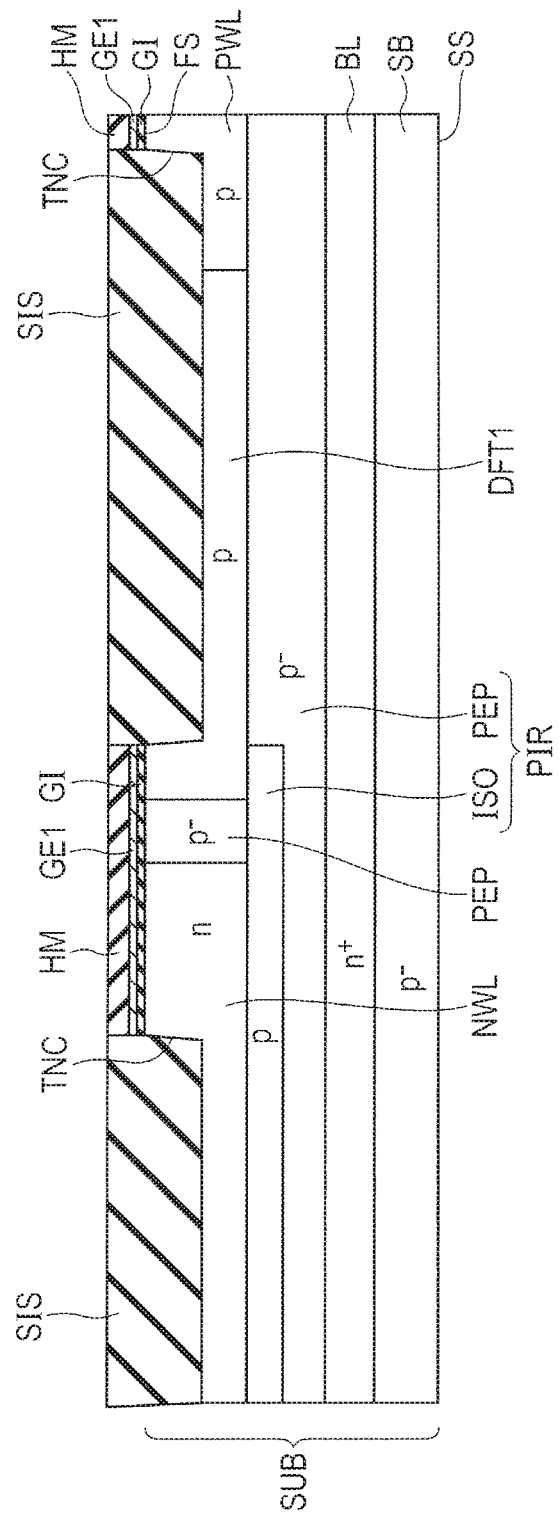
FIG. 11 is a schematic sectional view showing a fifth step of the method.

As shown in FIG. 11, the isolation insulating layer SIS including, for example, a silicon oxide film is formed so as to fill the isolation trench TNC. In the formation of the isolation insulating layer SIS, the insulating layer SIS is formed over the entire first surface FS of the semiconductor substrate SUB so as to fill the isolation trench TNC. Subsequently, the insulating layer SIS is polished by, for example, chemical mechanical polishing (CMP) until the surface of the hard mask layer HM is exposed. As a result, the isolation insulating layer SIS is left only in the isolation trench TNC. Consequently, the STI including the isolation trench TNC and the isolation insulating layer SIS is formed. Subsequently, the hard mask layer HM is removed by etching, for example.

Figure 12:
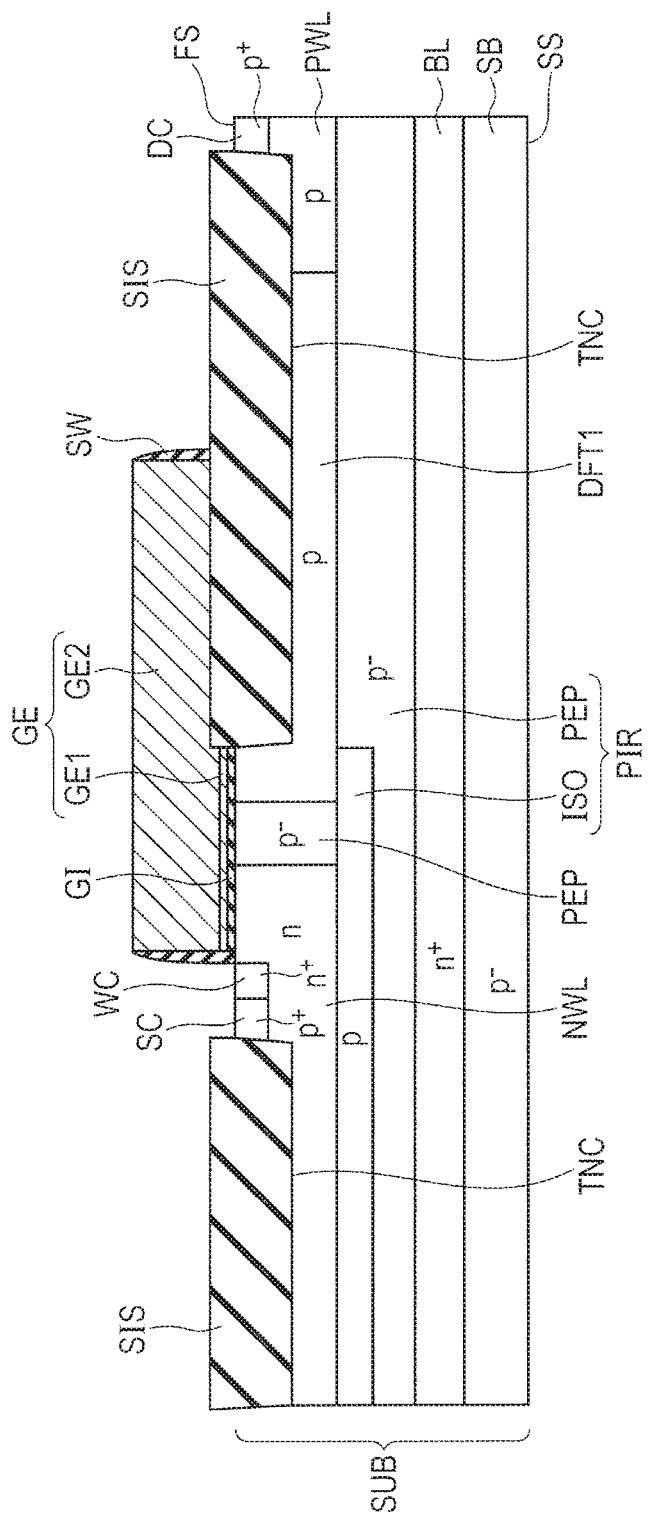
FIG. 12 is a schematic sectional view showing a sixth step of the method.

As shown in FIG. 12, a conductive film GE2 made of, for example, doped polysilicon is formed over the entire first surface FS of the semiconductor substrate SUB. The conductive film GE2 is formed with a thickness of several tens of nanometers, for example. Subsequently, the conductive films GE1 and GE2 are patterned by a typical photoengraving technique and an etching technique. As a result, the gate electrode GE including the conductive films GE1 and GE2 is formed.

A sidewall-shaped sidewall insulating layer SW is formed on each sidewall of the gate electrode GE. Subsequently, an n-type impurity and a p-type impurity are implanted by ion implantation or the like into the first surface FS of the semiconductor substrate SUB.

As a result, the p$^+$ source region SC, the p$^+$ drain region DC, and the n$^+$ contact region WC are formed in the first surface FS of the semiconductor substrate SUB.

In the diode AID of this embodiment, the n$^+$ contact region WC1 is formed so as to be located between the n-type body region NWL and the p$^+$ source region SC in the first surface FS. The n$^+$ contact region WC is formed so as to be located between a region directly below the gate electrode GE and the p$^+$ source region SC.

Figure 13:
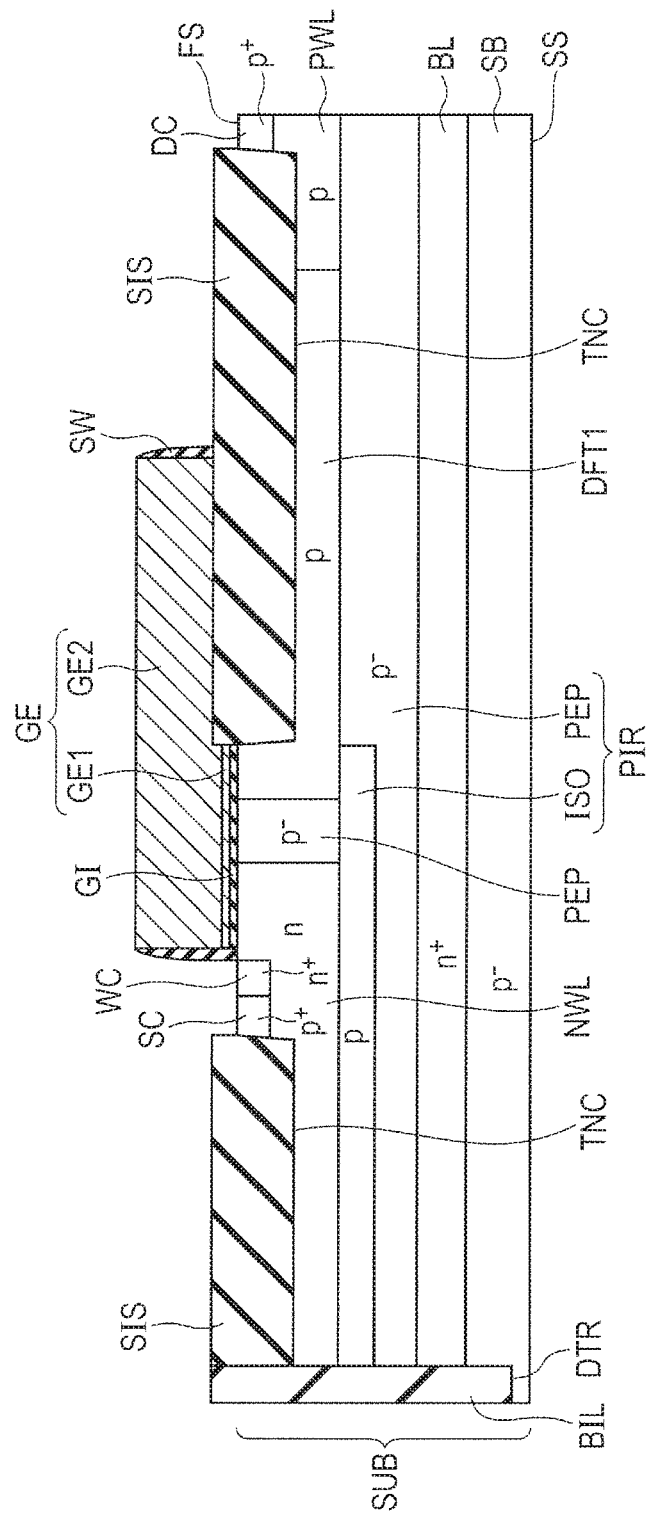
FIG. 13 is a schematic sectional view showing a seventh step of the method.

As shown in FIG. 13, the trench DTR is formed so as to extend from the upper surface of the isolation insulating layer SIS into the p$^-$ substrate region SB. The trench DTR is formed so as to extend from the first surface FS toward the second surface SS. The insulating layer BIL including, for example, a silicon oxide film is formed so as to fill the trench DTR. Consequently, the DTI including the trench DTR and the insulating layer BIL is formed.

As shown in FIGS. 2 and 3, the interlayer insulating layer IS, the plug conductive layers PL, and the interconnection layer INC are formed. Consequently, in the diode AID of this embodiment, the gate electrode GE, the p$^+$ source region SC, and the n-type body region NWL are formed so as to be electrically coupled to one another through the interconnection layer INC and the plug conductive layers PL. In this way, the semiconductor device of this embodiment is manufactured.

Functions and effects of this embodiment are now described together with the investigations performed by the inventors.

First, the inventors have examined forward I-V characteristics of the diode AID for each of the configuration of the diode AID of this embodiment and a configuration of a comparative example. The configuration of the comparative example means a configuration where positions of the p$^+$ source region SC and the n$^+$ contact region WC1 are exchanged from each other in the configuration of the diode AID shown in FIG. 2. Results of such examination are shown in FIG. 14.

The above-described forward I-V characteristics show variations in cathode current (Ik) when a cathode potential (Vk) is varied in a range from 0 to −1.2 V assuming that the diode AID has an anode potential (Va) of 0 V, a gate potential (Vg) equal to the cathode potential (Vk), and a substrate potential (Vsub) of −5 V.

Figure 14:
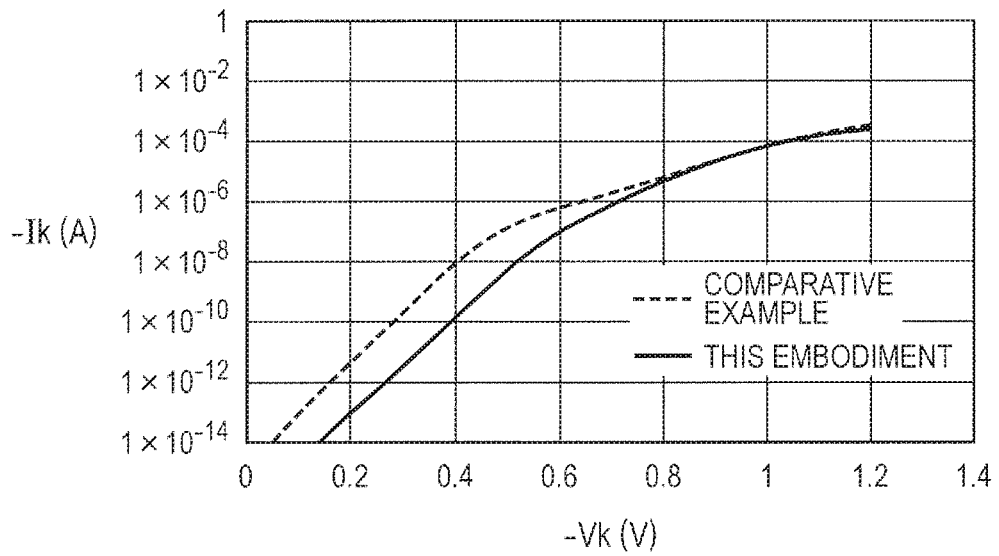
FIG. 14 shows respective forward I-V characteristics of the embodiment and a comparative example.

As clearly shown in FIG. 14, when a negative voltage is applied to a cathode (gate), a larger amount of cathode current flows in the comparative example than in this embodiment in a low voltage region of the cathode (gate). The reason for this is considered as follows. That is, in the configuration of the comparative example, when a negative voltage is applied to the gate, a channel is formed, and a negative potential is applied to the source. This leads to hole flow from the drain to the source, and thus a MOS transistor is turned on in a reverse direction. As a result, a current flows through the MOS transistor in the low voltage region of the gate, causing erroneous operation.

On the other hand, in this embodiment, as shown in FIGS. 2 and 3, the $n^+$ contact region WC1 is located between the n-type body region NWL and the $p^+$ source region SC in the first surface FS. This allows a channel to be less likely to be formed at a position of the $n^+$ contact region WC1; hence, it is suppressed that the MOS transistor part of the diode AID is turned on in a reverse direction in the low voltage region of the gate electrode GE. As a result, erroneous operation can be suppressed.

The diode AID of this embodiment has the gate electrode GE. It is therefore possible to provide the field plate effect by the gate electrode GE. This makes it possible to relieve the electric field concentration at the substrate surface, allowing a high withstand voltage to be easily maintained.

In this embodiment, as shown in FIGS. 2 and 3, the $n^+$ contact region WC1 is disposed between the region directly below the gate electrode GE and the $p^+$ source region SC. This makes it possible to separate the $p^+$ source region SC from the region directly below the gate electrode GE. It is therefore possible to more effectively suppress the phenomenon where the MOS transistor part is turned on in a reverse direction in the low voltage region of the gate electrode GE.

In this embodiment, as shown in FIGS. 5 and 6, the n-type impurity concentration of the $n^+$ contact region WC1 is at least 100 times higher than the n-type impurity concentration of the n-type body region NWL. This makes it possible to more effectively suppress the phenomenon where the MOS transistor part is turned on in a reverse direction in the low voltage region of the gate electrode GE.

In this embodiment, as shown in FIGS. 2 and 3, the n-type buried region BL is disposed between the semiconductor substrate SUB and the $p^+$ drain region DC. This makes it possible to electrically isolate the diode AID from the electric potential of the semiconductor substrate SUB.

In this embodiment, as shown in FIGS. 2 and 3, the gate electrode GE overrides the isolation insulating layer SIS of the STI. This effectively provides a field plate effect by the gate electrode GE.

Variations in arrangement of the $p^+$ source region SC and the $n^+$ contact regions WC1 and WC2 are described with reference to FIGS. 15A, 15B, and 15C.

Figure 15A:
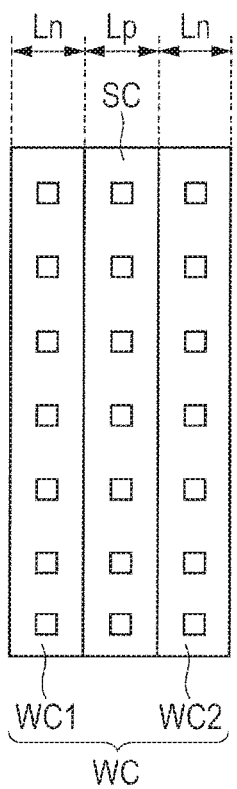
FIGS. 15A, 15B, and 15C are plan views showing variations in arrangement of a source region.

As shown in FIG. 15A, the $n^+$ contact region WC may include two $n^+$ contact regions WC1 and WC2 isolated from each other in the first surface FS. The two $n^+$ contact regions WC1 and WC2 may lie across the $p^+$ source region SC from each other. That is, the $n^+$ contact region WC1, the $p^+$ source region SC, and the $n^+$ contact region WC2 may be arranged in this order.

Figure 15B:
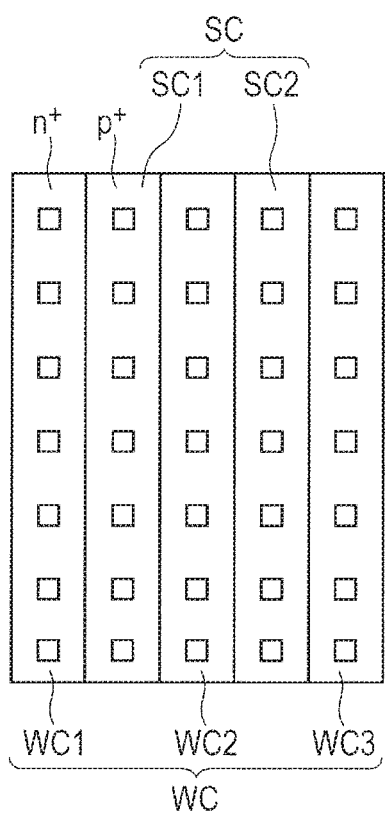

As shown in FIG. 15B, a plurality of $p^+$ source regions SC1, SC2, . . . , and a plurality of $n^+$ contact regions WC1, WC2, WC3, . . . may be alternately arranged in stripes.

Figure 15C:
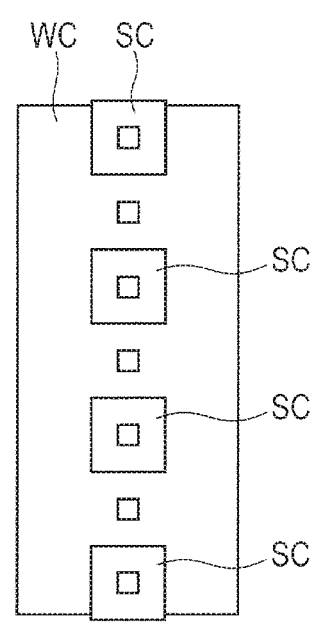

As shown in FIG. 15C, the periphery of the $p^+$ source region SC may be surrounded by the $n^+$ contact region WC1 such that the $p^+$ source region SC has a dot shape in the first surface FS.

Figure 16:
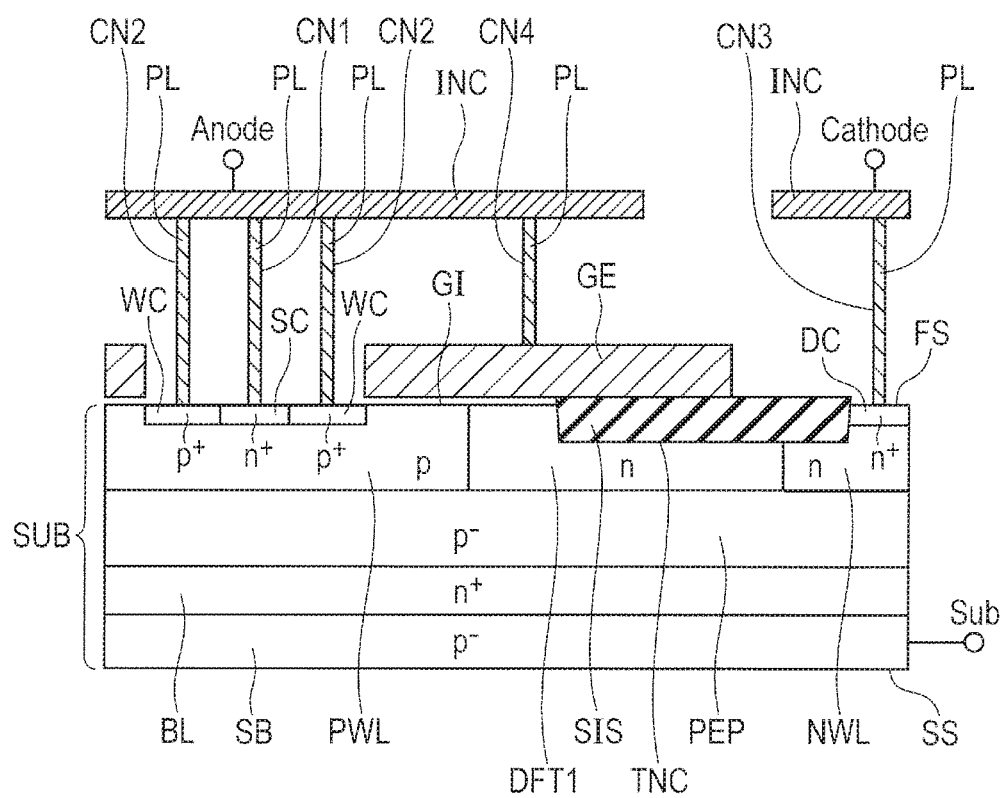
FIG. 16 is a sectional view showing a configuration formed by applying the configuration of the embodiment to an AID including an nLDMOS transistor.

As shown in FIG. 16, the diode AID, to which this disclosure is applied, may be configured such that the gate electrode GE of the nLDMOS transistor is electrically coupled to the $n^+$ source region SC and the p-type body region PWL. Such a configuration is described below.

In the formation region of the AID, the $p^-$ substrate region SB is disposed in the second surface SS of the semiconductor substrate SUB. The $n^+$ buried region BL (buried region) and the $p^-$ epitaxial region PEP (impurity region) are disposed on the first surface FS side of the $p^-$ substrate region SB.

The n-type well region NWL, the n-type drift region DFT1, and the p-type body region PWL (body region) are mainly disposed on the first surface FS side of the $p^-$ epitaxial region PEP.

The p-type body region PWL configures a pn junction in conjunction with the n-type drift region DFT1. The n-type drift region DFT1 is adjacent to the n-type well region NWL. The second surface SS side of the n-type well region NWL entirely configures a pn junction in conjunction with the $p^-$ epitaxial region PEP. The $n^+$ drain region DC is disposed in the first surface FS in the n-type well region NWL. The $n^+$ drain region DC has a higher n-type impurity concentration than the n-type well region NWL.

The second surface SS side of the n-type drift region DFT1 entirely configures a pn junction in conjunction with the $p^-$ epitaxial region PEP.

The p-type body region PWL is formed on the first surface FS side of the $n^+$ buried region BL. The second surface SS side of the p-type body region PWL is entirely in contact with the $p^-$ epitaxial region PEP. The p-type body region PWL has a higher p-type impurity concentration than the $p^-$ epitaxial region PEP.

The $n^+$ source region SC and the $p^+$ contact regions WC are disposed in the first surface FS of the p-type body region PWL. The $n^+$ source region SC and each $p^+$ contact region WC are adjacent to each other. The respective $p^+$ contact regions WC are disposed on both sides of the $n^+$ source region SC in the first surface FS.

The $n^+$ source region SC configures a pn junction in conjunction with each of the p-type well region PWL and the $p^+$ contact regions WC. The $n^+$ source region SC is formed in the first surface FS so as to lie across the p-type body region PWL and the n-type drift region DFT1 from the $n^+$ drain region DC. The $p^+$ contact region WC has a higher p-type impurity concentration than the p-type body region PWL.

The STI is disposed between the $n^+$ source region SC and the $n^+$ drain region DC. The STI includes the isolation trench TNC and the isolation insulating layer SIS filling the isolation trench TNC. The isolation insulating layer SIS is disposed in the first surface FS between the $n^+$ drain region DC and the p-type body region PWL.

The gate electrode GE is disposed over the first surface FS, which is located between the $p^+$ contact region WC and the STI, with the gate insulating layer GI in between. The gate electrode GE is isolatedly opposed to the first surface FS located between the $p^+$ contact region WC and the STI. Specifically, the gate electrode GE is isolatedly opposed to the p-type body region PWL and the n-type drift region DFT1, which are located between the $n^+$ source region SC and the STI. The gate electrode GE overrides the isolation insulating layer SIS of the STI. The gate electrode GE is opposed to the n-type drift region DFT1 with the isolation insulating layer SIS of the STI in between.

In the diode AID, each $p^+$ contact region WC is disposed between the p-type body region PWL and the $n^+$ source region SC in the first surface FS. The $p^+$ contact region WC is disposed between a region directly below the gate electrode GE and the $n^+$ source region SC.

The interlayer insulating layer IS is disposed over the first surface FS of the semiconductor substrate SUB so as to cover the diode AID. The interlayer insulating layer IS has the contact holes CN1, CN2, CN3, and CN4 that extend up to the n⁺ source region SC, the p⁺ contact regions WC, the n⁺ drain region DC, and the gate electrode GE, respectively. The plug conductive layer PL is buried in each of the contact holes CN1, CN2, CN3, and CN4. The interconnection layer INC is disposed on the interlayer insulating layer IS so as to be in contact with the plug conductive layers PL. As a result, the interconnection layer INC is electrically coupled to the respective impurity regions via the plug conductive layers PL.

The diode AID including the nLDMOS transistor can provide the effects similar to those of the diode AID including the pLDMOS transistor shown in FIG. 3.

Although the invention achieved by the inventors has been described in detail according to the embodiment hereinbefore, the invention should not be limited thereto, and it will be appreciated that various modifications or alterations thereof may be made within the scope without departing from the gist of the invention.

What is claimed is:

1. A semiconductor device, comprising:
   a semiconductor substrate having a main surface;
   a n-conductivity-type body region disposed in the main surface of the semiconductor substrate;
   a p-conductivity-type drain region disposed in the main surface of the semiconductor substrate;
   a p-conductivity-type source region disposed in the main surface of the semiconductor substrate so as to lie across the n-conductivity-type body region from the p-conductivity-type drain region;
   a gate electrode disposed in the main surface of the semiconductor substrate, and isolatedly opposed to the n-conductivity-type body region;
   a n-conductivity-type first impurity region having a higher concentration of a n-conductivity-type impurity than the body region; and
   an insulating layer embedded in a trench formed in the semiconductor substrate so as to surround the n-conductivity-type body region, the p-conductivity-type drain region, the p-conductivity-type source region, and the n-conductivity-type first impurity region,
   wherein the gate electrode, the p-conductivity-type source region, and the n-conductivity-type body region are electrically coupled to one another,
   wherein, in a direction from the p-conductivity-type source region toward the gate electrode, the n-conductivity-type first impurity region is disposed between the n-conductivity-type body region and the p-conductivity-type source region,
   wherein the semiconductor substrate comprises a p-conductivity-type epitaxial region formed so as to directly contact with the n-conductivity-type body region, and
   wherein the trench penetrates the p-conductivity-type epitaxial region.

2. The semiconductor device according to claim 1, wherein the n-conductivity-type first impurity region is disposed between a region directly below the gate electrode and the p-conductivity-type source region.

3. The semiconductor device according to claim 1, wherein the concentration of the n-conductivity-type impurity of the n-conductivity-type first impurity region is at least 100 times higher than a concentration of the n-conductivity-type impurity of the n-conductivity-type body region.

4. The semiconductor device according to claim 1, further comprising a n-conductivity-type second impurity region disposed in the main surface of the semiconductor substrate, wherein, in the main surface, the p-conductivity-type source region lies between the n-conductivity-type first impurity region and the second impurity region.

5. The semiconductor device according to claim 4, wherein the n-conductivity-type first impurity region, the second impurity region, and the p-conductivity-type source region are arranged in stripes.

6. The semiconductor device according to claim 1, wherein a periphery of the p-conductivity-type source region is surrounded by the n-conductivity-type first impurity region such that the p-conductivity-type source region has a dot shape in the main surface.

7. The semiconductor device according to claim 1, further comprising an isolation insulating layer disposed in the main surface of the semiconductor substrate between the p-conductivity-type drain region and the n-conductivity-type body region,
   wherein the gate electrode overrides the isolation insulating layer.

8. The semiconductor device according to claim 1,
   wherein the semiconductor substrate comprises a p-conductivity-type anti-punch-through layer formed in the p-conductivity-type epitaxial region, and
   wherein the p-conductivity-type anti-punch-through layer has a higher impurity concentration than the p-conductivity-type epitaxial region.

9. The semiconductor device according to claim 8, wherein the p-conductivity-type anti-punch-through layer directly contacts with the n-conductivity-type body region.

10. The semiconductor device according to claim 1,
    wherein the semiconductor substrate has:
      a first formation region in which a first MOS transistor is formed; and
      a second formation region in which a second MOS transistor is formed,
    wherein the first MOS transistor comprises the n-conductivity-type body region, the p-conductivity-type drain region, the p-conductivity-type source region, the gate electrode and the n-conductivity-type first impurity region, and
    wherein the insulating layer is formed between the first formation region and the second formation region.

11. A method of manufacturing a semiconductor device, comprising the steps of:
    forming a p-conductivity-type epitaxial region in a semiconductor substrate;
    forming a n-conductivity-type body region in a main surface of the semiconductor substrate;
    forming a gate electrode in the main surface of the semiconductor substrate so as to be isolatedly opposed to the n-conductivity-type body region;
    forming a p-conductivity-type drain region and a p-conductivity-type source region in the main surface of the semiconductor substrate so as to lie across the gate electrode from each other; and
    forming a n-conductivity-type first impurity region having a higher concentration of a n-conductivity-type impurity than the n-conductivity-type body region; and
    forming an insulating layer embedded in a trench formed in the semiconductor substrate so as to surround the n-conductivity-type body region, the p-conductivity-type drain region, the p-conductivity-type source region, and the n-conductivity-type first impurity region,
    wherein the gate electrode, the p-conductivity-type source region, and the n-conductivity-type body region are electrically coupled to one another, wherein, in a direction from the p-conductivity-type source region toward the gate electrode, the n-conductivity-type first impurity region is formed so as to be disposed between the n-conductivity-type body region and the p-conductivity-type source region, wherein the p-conductivity-type epitaxial region is formed so as to directly contact with the n-conductivity-type body region, and wherein the trench penetrates the p-conductivity-type epitaxial region.

12. The method according to claim 11, wherein the n-conductivity-type first impurity region is formed between a region directly below the gate electrode and the p-conductivity-type source region.

13. The method according to claim 11, comprising forming a p-conductivity-type anti-punch-through layer in the p-conductivity-type epitaxial region, wherein the p-conductivity-type anti-punch-through layer has a higher impurity concentration than the p-conductivity-type epitaxial region.

14. The method according to claim 13, wherein the p-conductivity-type anti-punch-through layer directly contacts with the n-conductivity-type body region.

15. The method according to claim 11, wherein the semiconductor substrate has:

a first formation region in which a first MOS transistor is formed; and a second formation region in which a second MOS transistor is formed, wherein the first MOS transistor comprises the n-conductivity-type body region, the p-conductivity-type drain region, the p-conductivity-type source region, the gate electrode and the n-conductivity-type first impurity region, and wherein the insulating layer is formed between the first formation region and the second formation region.

* * * * *